(12) United States Patent
Chen et al.

(10) Patent No.: US 10,993,358 B1
(45) Date of Patent: Apr. 27, 2021

(54) DEVICE FOR REMOVING PORTION OF COVER AND METHOD OF REMOVING PORTION OF COVER

(71) Applicant: Unimicron Technology Corp., Taoyuan (TW)

(72) Inventors: Chi-Shiang Chen, New Taipei (TW); Bo-Han Li, Chiayi (TW)

(73) Assignee: Unimicron Technology Corp., Taoyuan (TW)

( * ) Notice: Subject to any disclaimer, the term of this patent is extended or adjusted under 35 U.S.C. 154(b) by 0 days.

(21) Appl. No.: 16/741,765

(22) Filed: Jan. 14, 2020

(30) Foreign Application Priority Data

Nov. 25, 2019 (TW) .................................. 108142790

(51) Int. Cl.
*B32B 43/00* (2006.01)
*H05K 13/04* (2006.01)
*H05K 3/46* (2006.01)
*B32B 38/10* (2006.01)

(52) U.S. Cl.
CPC ....... *H05K 13/0408* (2013.01); *H05K 3/4691* (2013.01); *H05K 13/0419* (2018.08); *B32B 38/10* (2013.01); *B32B 43/006* (2013.01); *Y10T 156/11* (2015.01); *Y10T 156/1168* (2015.01); *Y10T 156/1174* (2015.01); *Y10T 156/19* (2015.01); *Y10T 156/195* (2015.01)

(58) Field of Classification Search
CPC ..... B32B 38/10; B32B 43/006; Y10T 156/11; Y10T 156/1168; Y10T 156/1174; Y10T 156/19; Y10T 156/195
See application file for complete search history.

(56) References Cited

U.S. PATENT DOCUMENTS

| 8,470,130 | B2 * | 6/2013 | Chong ............. H01L 21/67132 |
| | | | 156/707 |
| 2006/0021710 | A1 * | 2/2006 | Nitta ................. H01L 21/67132 |
| | | | 156/538 |
| 2007/0074822 | A1 * | 4/2007 | Akechi ............... B29C 63/0013 |
| | | | 156/750 |

(Continued)

FOREIGN PATENT DOCUMENTS

| CN | 102301845 B | 5/2015 |
| CN | 107222979 A | 9/2017 |

(Continued)

*Primary Examiner* — Mark A Osele
*Assistant Examiner* — Nickolas R Harm
(74) *Attorney, Agent, or Firm* — CKC & Partners Co., LLC (57) ABSTRACT

A device for removing a portion of cover is provided, which includes a lower platform and an upper platform oppositely disposed, a cover jig between the lower and upper platforms, a feed roller and a receiving roller oppositely disposed, and an adhesive film. The upper platform includes a plurality of protrusions, and each of the protrusions extends toward the lower platform. The cover jig includes a plurality of through holes, and each of the through holes is disposed opposite to each of the protrusions, so that each of the protrusions can be inserted through each of the through holes. One end of the adhesive film is connected to the feed roller, and the other end of the adhesive film is connected to the receiving roller, and a portion of the adhesive film between the two ends is located between the upper platform and the cover jig.

11 Claims, 5 Drawing Sheets

(56) References Cited

U.S. PATENT DOCUMENTS

| | | | | |
|---|---|---|---|---|
| 2008/0113486 A1* | 5/2008 | Eguchi | ............... | B32B 43/006 |
| | | | | 438/458 |
| 2009/0170290 A1* | 7/2009 | Maki | ............... | H01L 21/67132 |
| | | | | 438/464 |
| 2011/0155314 A1* | 6/2011 | Kobayashi | ........ | H01L 21/67132 |
| | | | | 156/249 |
| 2015/0367622 A1* | 12/2015 | Adachi | ............... | B32B 39/00 |
| | | | | 156/759 |

FOREIGN PATENT DOCUMENTS

| | | |
|---|---|---|
| CN | 106304694 B | 1/2019 |
| TW | 230292 B | 9/1994 |
| TW | 201513287 A | 4/2015 |
| TW | 201637549 A | 10/2016 |

* cited by examiner

DEVICE FOR REMOVING PORTION OF COVER AND METHOD OF REMOVING PORTION OF COVER

CROSS-REFERENCE TO RELATED APPLICATION

This application claims priority to Taiwan Application Serial Number 108142790, filed on Nov. 25, 2019, which is herein incorporated by reference.

BACKGROUND

Field of Invention

The present disclosure relates to a device and a method of removing a cover, and more particularly to a device and a method of removing a portion of the cover.

Description of Related Art

The circuit board can be divided into a rigid circuit board and a flexible circuit board according to the material of the dielectric layer. Later, a flexible-rigid composite board was developed, usually composed of flexible and rigid boards, to combine flexibility of the flexible board and strength of the rigid board.

In the prior art, an upper layer of the flexible-rigid composite board is covered with a cover to protect the circuit board. In order to expose the flexible circuit board in the inner layer, a region of the cover needed to be removed is firstly cut using laser, and the portion of the cover is then manually removed. However, the way in which the cover is manually removed is not only time consuming but also labor intensive. Therefore, the prior art needs to be improved.

SUMMARY

An object of one embodiment of the present disclosure is to provide a device for removing a portion of a cover to automatically remove the portion of the cover.

An embodiment of the present disclosure provides a device for removing a portion of a cover, which includes a lower platform, an upper platform, a cover jig, a feed roller, a receiving roller and an adhesive film. The upper platform is disposed opposite to the lower platform and vertically reciprocatingly moves, and the upper platform includes a plurality of protrusions, and each of the protrusions extends toward the lower platform. The cover jig is disposed between the lower platform and the upper platform, and the cover jig includes a plurality of through holes, and each of the through holes is disposed opposite to each of the protrusions, so that each of the protrusions is able to be inserted through each of the through holes. The feed roller is adjacent to the upper platform. The receiving roller is disposed opposite to a side of the upper platform adjacent to the feed roller. One end of the adhesive film is connected to the feed roller, and the other end is connected to the receiving roller, and a portion of the adhesive film between the two ends is located between the upper platform and the cover jig, in which the adhesive film toward a side of the cover jig is sticky.

In some embodiments, the lower platform includes a non-slip pad disposed at a side of the lower platform toward the upper platform.

In some embodiments, the protrusions are made of a soft material.

In some embodiments, the soft material includes silicone, sponge or a combination thereof.

In some embodiments, the cover jig is made of a material including metal, resin, glass fiber, polymer composite or a combination thereof.

In some embodiments, a side of the cover jig toward the upper platform is coated with a release material.

In some embodiments, the device for removing the portion of the cover further includes at least one pressing wheel disposed at a side adjacent to the cover jig and configured to press the adhesive film.

In some embodiments, the device for removing the portion of the cover further includes two pressing wheels, and each of the pressing wheels is respectively disposed and adjacent to two opposite sides of the cover jig and configured to press the portion of the adhesive film between the two ends.

In some embodiments, the device for removing the portion of the cover further includes at least one guide wheel disposed over the cover jig and adjacent to the receiving roller.

Another embodiment of the present disclosure provides a method of removing a portion of a cover, which includes: providing the above-mentioned device for removing the portion of the cover; providing a substrate having the cover; placing the substrate at the lower platform; moving the cover jig onto the substrate; pressing down the upper platform to allow the protrusions to pass through the through holes of the cover jig, so that the portion of the adhesive film between the two ends is adhered to the portion of the cover of the substrate; lifting up the upper platform; horizontally moving the lower platform, the cover jig and the adhesive film toward the receiving roller simultaneously and rolling the receiving roller simultaneously, so that the portion of the cover is removed from the substrate, and the adhesive film adhered with the portion of the cover is rolled and received by the receiving roller; moving the lower platform, the cover jig and the substrate that the portion of the cover is removed back beneath the upper platform; and lifting up the cover jig to move out the substrate that the portion of the cover is removed.

In some embodiments, before the substrate is placed at the lower platform, the method further includes horizontally moving the lower platform outside the feed roller, in which after the substrate is placed at the lower platform, the method further includes horizontally moving the lower platform back beneath the upper platform.

In some embodiments, after the cover jig is lifted up, the method further includes horizontally moving the lower platform outside the feed roller to move out the substrate that the portion of the cover is removed.

BRIEF DESCRIPTION OF THE DRAWINGS

The various aspects of the disclosure will be readily understood as the following detailed description is read in conjunction with the drawings. It should be noted that various features may not be drawn to scale in accordance with industry standard operating procedures. In fact, the dimensions of the various features can be arbitrarily increased or decreased for clarity of discussion.

DETAILED DESCRIPTION

In order that the present disclosure is described in detail and completeness, implementation aspects and specific embodiments of the present disclosure with illustrative description are presented, but it is not the only form for implementation or use of the specific embodiments of the present disclosure. The embodiments disclosed herein may be combined or substituted with each other in an advantageous manner, and other embodiments may be added to an embodiment without further description. In the following description, numerous specific details will be described in detail in order to enable the reader to fully understand the following embodiments. However, the embodiments of the present disclosure may be practiced without these specific details.

Further, spatially relative terms, such as "lower", "upper" and the like, are used to describe the relative relationship of an element or feature to other elements or features in the drawings. These spatially relative terms are intended to encompass different orientations of the device in use or operation in addition to the orientation shown in the drawings. The device can be otherwise positioned (e.g., rotated 90 degrees or other orientation), and the spatially relative descriptions used herein can also be correspondingly interpreted.

As used herein, unless the context specifically dictates otherwise, "a" and "the" may mean a single or a plurality. It will be further understood that "comprise", "include", "have", and similar terms as used herein indicate features, regions, integers, steps, operations, elements and/or components, but not exclude other features, regions, integers, steps, operations, elements, components and/or groups.

Figure 1:
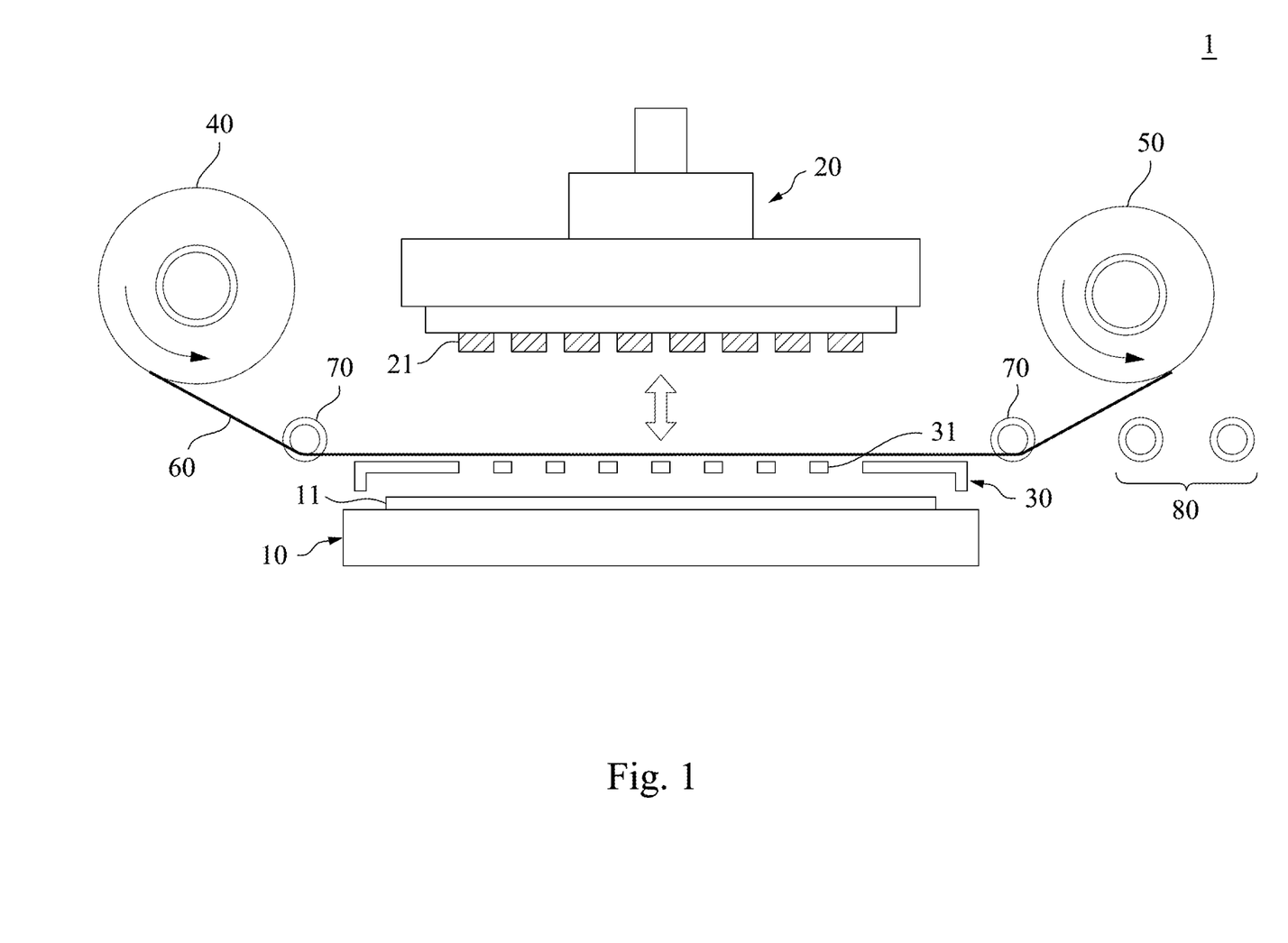
FIG. 1 is a schematic view of a device for removing a portion of a cover according to an embodiment of the present disclosure.

Some embodiments of the present disclosure provide a device for removing a portion of a cover, and the portion of the cover is automatically removed using the device to save manpower and time. FIG. 1 is a schematic view of a device for removing a portion of a cover according to an embodiment of the present disclosure.

In some embodiments, as shown in FIG. 1, a device 1 for removing the portion of the cover of the present disclosure includes a lower platform 10, an upper platform 20, a cover jig 30, a feed roller 40, a receiving roller 50, an adhesive film 60, a pressing wheel 70, and a guide wheel 80. Other structures/elements between the various components above are not shown for the sake of brevity.

The lower platform 10 includes a non-slip pad 11 disposed at a side of the lower platform 10 toward the upper platform 20. In an embodiment, the lower platform 10 can be horizontally reciprocatingly moved as desired.

The upper platform 20 is disposed opposite to the lower platform 10 and vertically reciprocatingly moves. The upper platform 20 includes a plurality of protrusions 21, and each of the protrusions 21 extends toward the lower platform 10. In an embodiment, the protrusions 21 are made of a soft material, in which the soft material includes, but are not limited to, silicone, sponge, or a combination thereof.

The cover jig 30 is disposed between the lower platform 10 and the upper platform 20, and the cover jig 30 includes a plurality of through holes 31, and each of the through holes 31 are disposed opposite to each of the protrusions 21, so that each of the protrusions 21 can be inserted through each of the through holes 31. In an embodiment, the cover jig 30 is made of a material including, but not limited to, metal, resin, glass fiber, polymer composite or a combination thereof. In one embodiment, a side of the cover jig 30 toward the upper platform is coated with a release material to allow the adhesive film 60 adhered to the cover jig 30 to be effectively removed without residue.

The feed roller 40 is adjacent to the upper platform 20, and the receiving roller 50 is disposed opposite to a side of the upper platform 20 adjacent to the feed roller 40. In one embodiment, the feed roller 40 is disposed at a left side of the upper platform 20, and the receiving roller 50 is disposed at a right side of the upper platform 20.

One end of the adhesive film 60 is connected to the feed roller 40, and the other end is connected to the receiving roller 50, and a portion of the adhesive film 60 between the two ends is located between the upper platform 20 and the cover jig 30, in which the adhesive film 60 toward a side of the cover jig 30 is sticky. In one embodiment, the adhesive film 60 has high viscosity and high strength to adhere to the cover to be removed, and the adhesive film 60 is not easily broken during the adhesion and pulling processes. In one embodiment, the sticky side of the adhesive film 60 faces downward.

When there is one pressing wheel 70, it is disposed at a side adjacent to the cover jig 30 and configured to press the adhesive film 60. In one embodiment, when there are two pressing wheels 70, each of the pressing wheels 70 is disposed and adjacent to two opposite sides of the cover jig 30 and configured to press the portion of the adhesive film 60 between the two ends.

There is one or more guide wheels 80, and the guide wheels 80 are sequentially disposed over the cover jig 30 and adjacent to the receiving roller 50.

Although a series of operations or steps are described below to illustrate the method disclosed herein, the order of the operations or steps is not to be construed as limiting. For example, certain operations or steps may be performed in a different order and/or concurrently with other steps. In addition, not all illustrated operations, steps, and/or features are required to implement embodiments of the present disclosure. Moreover, each of the operations or steps described herein can include a number of sub-steps or actions.

Figure 2:
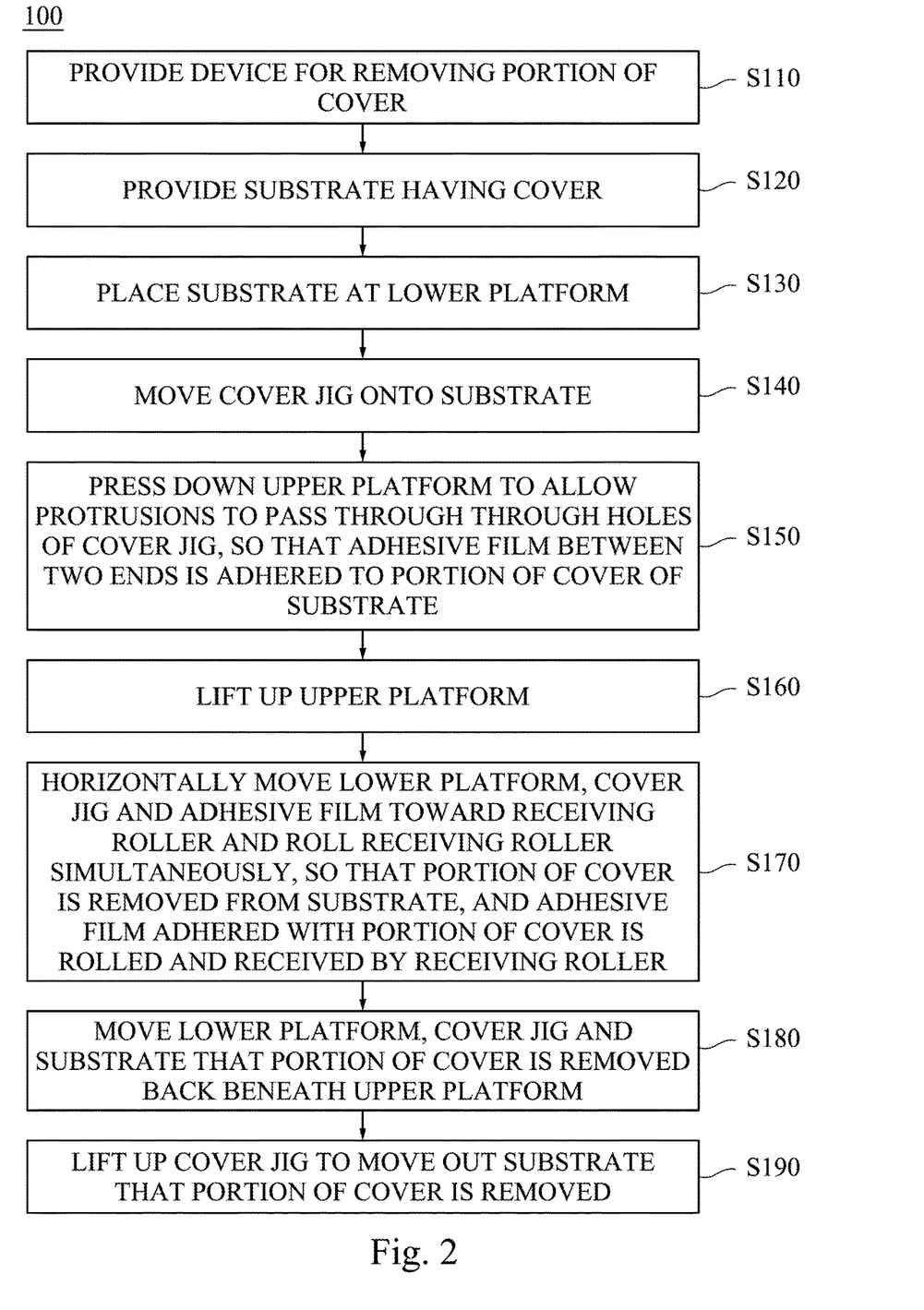
FIG. 2 is a flow chart of a method of removing a portion of a cover according to an embodiment of the present disclosure.
Figure 3:
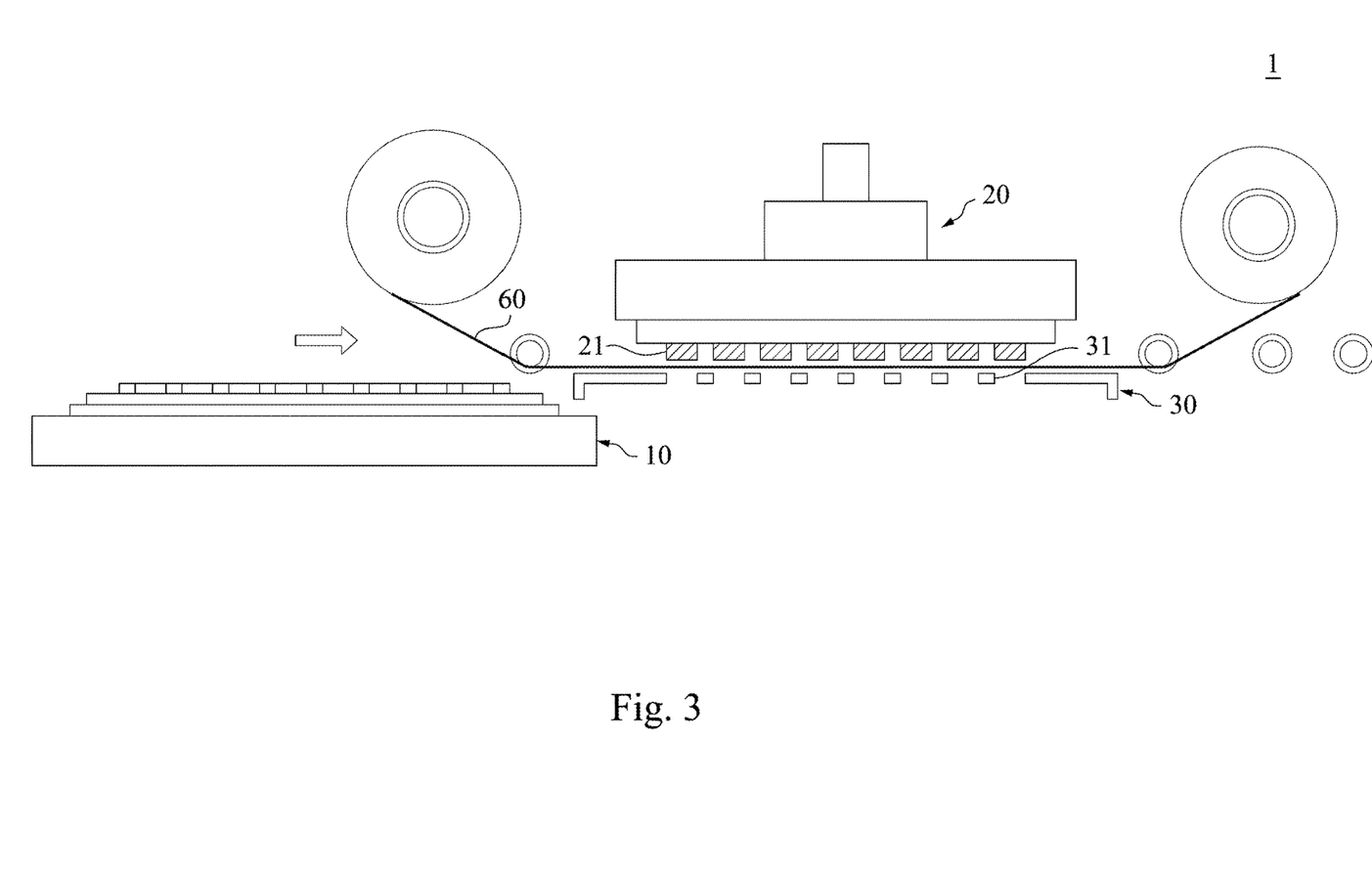
FIG. 3 is a cross-sectional view showing a method of removing a portion of a cover at some stages according to an embodiment of the present disclosure.
Figure 4:
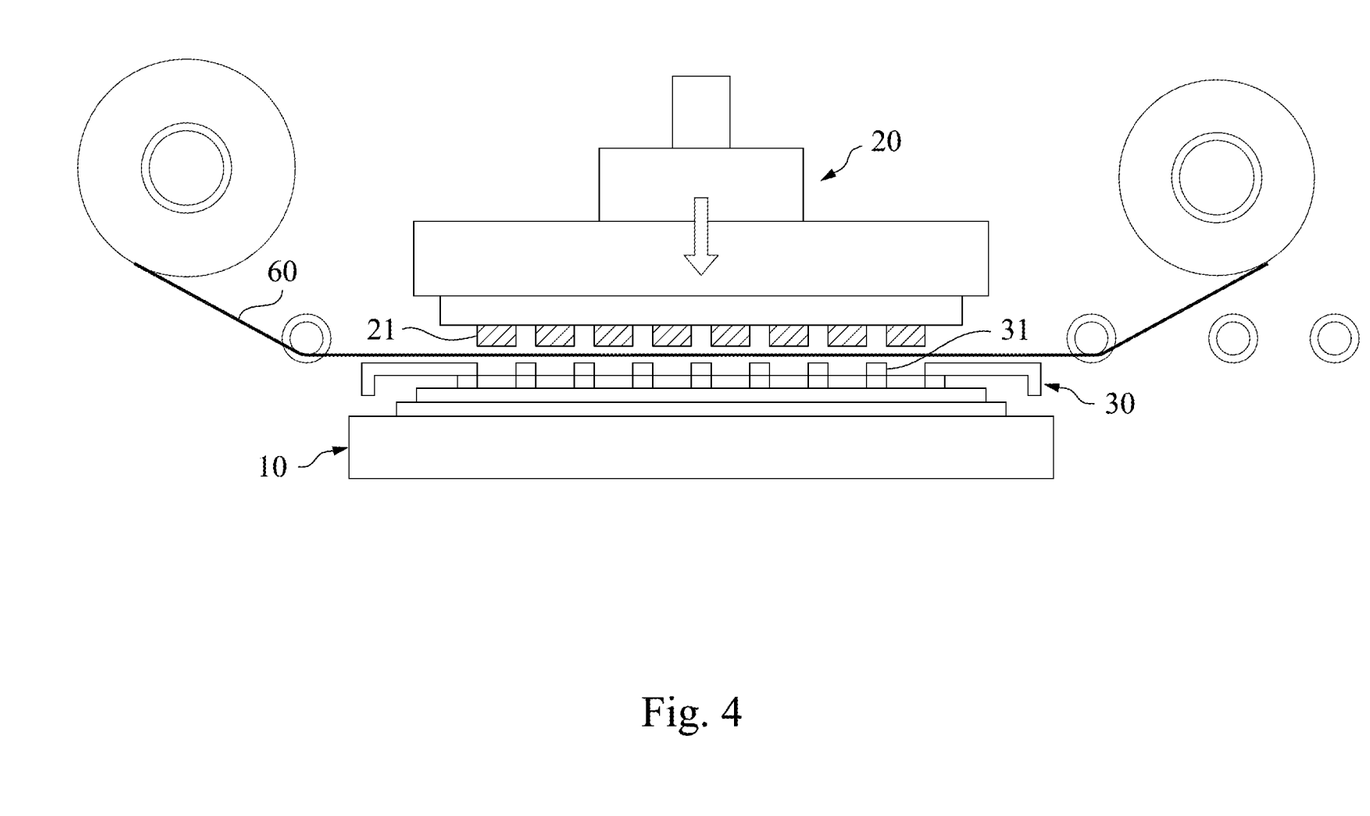
FIG. 4 is a cross-sectional view showing a method of removing a portion of a cover at some stages according to an embodiment of the present disclosure.
Figure 5:
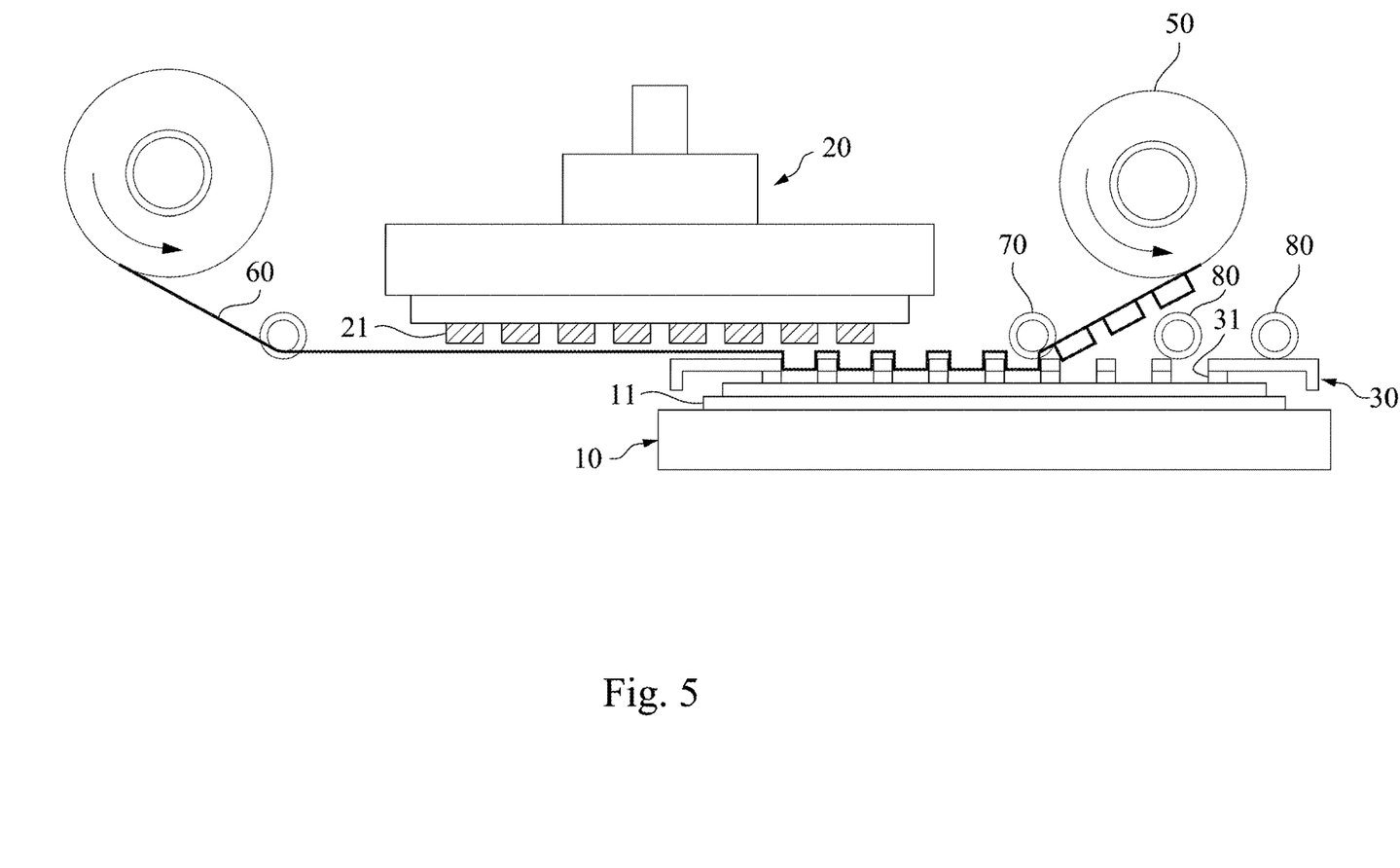
FIG. 5 is a cross-sectional view showing a method of removing a portion of a cover at some stages according to an embodiment of the present disclosure.

Some embodiments of the present disclosure further provide a method of removing a portion of a cover, and the portion of the cover is automatically removed by using the method to save manpower and time. FIG. 2 is a flow chart of a method of removing a portion of a cover according to an embodiment of the present disclosure, and FIGS. 3-5 are cross-sectional views showing a method of removing the portion of the cover at various stages according to various embodiments of the present disclosure. As shown in FIG. 2, the method 100 includes steps S110 to S190.

As shown in FIG. 3, in step S110, the device 1 for removing the portion of the cover as described above is provided. In step S120, a substrate having the cover is provided. In step S130, the substrate is placed at the lower platform 10. In one embodiment, the substrate is placed over the non-slip pad 11 of the lower platform 10 to avoid slippage of the substrate. In one embodiment, the lower platform 10 is horizontally moved outside the feed roller 40 before the substrate is placed at the lower platform 10. In one embodiment, after the substrate is placed at the lower platform 10, the lower platform 10 is horizontally moved back beneath the upper platform 20.

As shown in FIG. 4, in step S140, the cover jig 30 is moved onto the substrate. In step S150, the upper platform 20 is pressed down, and after the protrusions 21 pass through the through holes 31 of the cover jig 30, the portion of the adhesive film 60 between the two ends is adhered to the portion of the cover of the substrate.

As shown in FIG. 5, in step S160, the upper platform 20 is lifted up. In step S170, the lower platform 10, the cover jig 30 and the adhesive film 60 are horizontally moved toward the receiving roller 50 simultaneously, and the receiving roller 50 is rolled simultaneously, so that the portion of the cover is removed from the substrate, and the adhesive film 60 adhered with the portion of the cover is rolled and received by the receiving roller 50. In step S180, the lower platform 10, the cover jig 30 and the substrate that the portion of the cover is removed are moved back beneath the upper platform 20. In step S190, the cover jig 30 is lifted up to move out the substrate that the portion of the cover is removed. In one embodiment, after the cover jig 30 is lifted up, the lower platform 10 is horizontally moved outside the feed roller 40 to move out the substrate that the portion of the cover is removed.

In some embodiments, the protrusions 21 of the upper platform 20 and the through holes 31 of the cover jig 30 can be molded corresponding to the regions on the substrate where the portions of the cover need to be removed, so as to meet the needs of regions on different substrates where the portions of the cover need to be removed.

In some embodiments, the slippage of the substrate is inhibited by using the non-slip pad 11, and the deformation of the substrate such as a wave-like deformation when the adhesive film 60 is adhered and then moved to remove the cover is inhibited by using the pressing wheel 70 alone or in combination with the guide wheel 80.

Although the disclosure has been disclosed in the above embodiments, it is not intended to limit the disclosure, and it is to be understood that those skilled in the art can make various changes and modifications without departing from the spirit and scope of the disclosure. The scope of protection of the present disclosure is subject to the definition of the scope of claims.

What is claimed is:

1. A device for removing a portion of a cover, comprising:
   a lower platform;
   an upper platform disposed opposite to the lower platform and vertically reciprocatingly moving, the upper platform including a plurality of protrusions, each of the protrusions extending toward the lower platform;
   a cover jig disposed between the lower platform and the upper platform, the cover jig including a plurality of through holes, each of the through holes disposed opposite to a respective protrusion of the plurality of protrusions, so that each of the protrusions is able to be inserted through a respective through hole of the plurality of through holes;
   a feed roller adjacent to the upper platform;
   a receiving roller disposed opposite to a side of the upper platform adjacent to the feed roller; and
   an adhesive film, one end of the adhesive film connected to the feed roller, an other end of the adhesive film connected to the receiving roller, and a portion of the adhesive film between the one end and the other end of the adhesive film located between the upper platform and the cover jig, wherein the adhesive film toward a side of the cover jig is sticky.

2. The device for removing the portion of the cover of claim 1, wherein the lower platform comprises a non-slip pad disposed at a side of the lower platform toward the upper platform.

3. The device for removing the portion of the cover of claim 1, wherein the protrusions comprise silicone, sponge or a combination thereof.

4. The device for removing the portion of the cover of claim 1, wherein the cover jig is made of a material comprising metal, resin, glass fiber, polymer composite or a combination thereof.

5. The device for removing the portion of the cover of claim 1, wherein a side of the cover jig toward the upper platform is coated with a release material.

6. The device for removing the portion of the cover of claim 1, further comprising at least one pressing wheel disposed at a side adjacent to the cover jig and configured to press the adhesive film.

7. The device for removing the portion of the cover of claim 6, further comprising two pressing wheels, each of the pressing wheels respectively disposed and adjacent to two opposite sides of the cover jig and configured to press the portion of the adhesive film between the one end and the other end of the adhesive film.

8. The device for removing the portion of the cover of claim 1, further comprising at least one guide wheel disposed over the cover jig and adjacent to the receiving roller.

9. A method of removing a portion of a cover, comprising:
   providing the device for removing the portion of the cover of claim 1;
   providing a substrate having the cover;
   placing the substrate at the lower platform;
   moving the cover jig onto the substrate;
   pressing down the upper platform to allow the protrusions to pass through the through holes of the cover jig, so that the portion of the adhesive film between the one end and the other end of the adhesive film is adhered to the portion of the cover of the substrate;
   lifting up the upper platform;
   horizontally moving the lower platform, the cover jig and the adhesive film toward the receiving roller simultaneously and rolling the receiving roller simultaneously, so that the portion of the cover is removed from the substrate, and the adhesive film adhered with the portion of the cover is rolled and received by the receiving roller;
   moving the lower platform, the cover jig and the substrate that the portion of the cover is removed back beneath the upper platform; and
   lifting up the cover jig to move out the substrate that the portion of the cover is removed.

10. The method of removing the portion of the cover of claim 9,
   wherein before the substrate is placed at the lower platform, the method further comprises horizontally moving the lower platform outside the feed roller,
   wherein after the substrate is placed at the lower platform, the method further comprises horizontally moving the lower platform back beneath the upper platform.

11. The method of removing the portion of the cover of claim 10, wherein after the cover jig is lifted up, the method further comprises horizontally moving the lower platform outside the feed roller to move out the substrate that the portion of the cover is removed.

* * * * *